United States Patent [19]

Braun et al.

[11] Patent Number: 4,521,712
[45] Date of Patent: Jun. 4, 1985

[54] PRESSURE SENSITIVE PIEZOELECTRIC SIGNAL GENERATOR ASSEMBLY

[75] Inventors: Derrek E. Braun, Royal Oak; Daniel T. Lau, Westland; Harold Moy, Mt. Clemens, all of Mich.

[73] Assignee: United Technologies Automotive, Inc., Dearborn, Mich.

[21] Appl. No.: 555,268

[22] Filed: Nov. 25, 1983

[51] Int. Cl.³ .............................................. H01L 41/08
[52] U.S. Cl. .................................... 310/339; 310/340; 340/365 A
[58] Field of Search ............... 310/338, 339, 340, 311, 310/334; 340/365 A

[56] References Cited

U.S. PATENT DOCUMENTS

| | | | |
|---|---|---|---|
| 2,816,236 | 12/1957 | Rosen | 310/311 X |
| 2,875,355 | 2/1959 | Petermann | 310/334 |
| 3,150,275 | 9/1964 | Lucy | 310/334 |
| 3,327,286 | 6/1967 | Dorr et al. | 310/334 |
| 3,339,104 | 8/1967 | Kushner et al. | 310/339 X |
| 4,190,785 | 2/1980 | Kompanek | 310/339 X |
| 4,211,949 | 7/1980 | Brisken et al. | 310/334 X |

FOREIGN PATENT DOCUMENTS 2070342 9/1981 United Kingdom .......... 340/365 A

Primary Examiner—Mark O. Budd
Attorney, Agent, or Firm—Stephen A. Schneeberger

[57] ABSTRACT

A pressure sensitive signal generator assembly includes a piezoelectric subassembly, a flexible electroluminescent panel and a transparent cover element so arranged that the cover element is in force-transmitting relation with the piezoelectric subassembly and the electroluminescent panel is interposed therebetween. The piezoelectric subassembly includes a substantially planar, rigid yet manually flexible, substrate member; one or typically several, discrete piezoelectric elements, preferably crystals; and electrical conductors connected to the opposite surfaces of respective piezoelectric elements for developing a voltage therebetween in response to deformation of the piezoelectric element. An applique sheet, interposed between the cover and the electroluminescent panel contains indicia for identifying the respective piezoelectric elements. The cover element may be an integral portion of a plastic housing in which the signal generator assembly is housed. The various members of the signal generator assembly are maintained in sealed, force-transmitting relation by potting compound within the housing.

11 Claims, 2 Drawing Figures

PRESSURE SENSITIVE PIEZOELECTRIC SIGNAL GENERATOR ASSEMBLY

TECHNICAL FIELD

The present invention relates to a signal generator and more particularly to an improved signal generator assembly employing one or more piezoelectric devices as respective sources of electrical signals in response to the application of respective input forces. The invention further relates to an improved signal generator assembly for an entry system.

BACKGROUND ART

A large variety of devices exist for the generation and/or input of electrical signals to electrically-controlled machines in response to the application of an input force. On such type of electrical signal generator employs one or more piezoelectric elements for generating electrical signals in response to respective manual actuation. such piezoelectric signal generators are used in a variety of applications requiring durability at a reasonable cost, as for instance to provide the input device for various keyless or coded entry systems as for automobiles, offices, residences, etc. More specifically, U.S. Pat. No. 4,190,785 to Kompanek for "Pressure Sensitive Signal Generator Using Piezoelectric Coating" discloses a signal generator employing a piezoelectric material deposited on a substrate as a slurry and subsequently cured. Further, a signal generator of such construction is disclosed as the input generator for an entry system associated with an automobile in U.S. Pat. No. 4,206,491 for "Entry System" by Ligman et al.

The piezoelectric signal generator disclosed in the two aforementioned patents employs a coating of piezoelectric ceramic material as its pressure responsive electrical signal generator. The piezoelectric ceramic is applied to a metallic substrate in the form of a slurry and is subsequently cured to provide an adherent coating. A plurality of electrodes are bonded to the piezoelectric coating at various locations on its surface opposite to the surface bonded to the substrate. The application of manual force to the substrate in the region of one of the electrodes serves to deform the piezoelectric material thereat to generate an electrical signal at the electrode.

While such slurry-deposited piezoelectric signal generators have been effective electrical signal sources, they also have had certain limitations. For instance, because in the signal generator embodiments illustrated in the two aforementioned patents the piezoelectric ceramic is applied as a continuous coating, it is somewhat difficult to provide a plurality of discrete signal generating locations due to the effects of electrical cross-talk. Further still, the slurry-deposited piezoelectric ceramic coating characteristically requires a significant pressure of deformation to provide a particular voltage output, and may be adversely affected by high moisture levels.

On the other hand, other signal generating devices such as the "Manual Electronic Keyboard" of U.S. Pat. No. 3,464,531 to Herr et al have existed for the provision of electrical signals in response to manual actuation of discrete piezoelectric crystals. Such configuration has the advantage that the crystals may be capable of providing a stronger electrical signal than a slurry-deposited piezoelectric ceramic and it avoids the problem of cross-talk. However, the actuating mechanism of the U.S. Pat. No. 3,464,531 is relatively complex and bulky, and is subject to fatigue resulting from repeated displacement of the actuator.

Still further, it may be desirable in certain instances to provide illumination for the signal generating devices. One such example is seen in the aforementioned U.S. Pat. No. 4,206,491 wherein a bulb mounted near the signal generator provides illumination when the generator is first operated. That arrangement requires, a bulb separate from the generator and may not provide uniform illumination. Another example is seen in U.S. Pat. No. 4,060,703 to Everett for "Keyboard Switch Assembly With Tactile Feedback Having Illuminated Laminated Layers Including Opaque or Transparent Conductive Layer" which provides a flexible electroluminescent panel in a sandwich type computer keyboard with keys characterized by tactility. However, that type of switch assembly is relatively bulky in order to accommodate the required actuator displacement, which displacement also tends to limit the service life of the switch. Moreover, such switch assembly is more suited for the relatively "friendly" environment of computer keyboard usage than for the environment of an entry system which may be exposed to darkness and the elements.

Although a variety of signal generating switches have possessed one or more of the qualities hereinbefore discussed, none are available which combine most or all of those features so as to be especially suited for providing input signals for an entry system.

DISCLOSURE OF INVENTION

It is a principal object of the invention to provide an improved signal generator especially suited for providing input signals for an entry system. Included within this object is the provision of a signal generator assembly which is long-lived and durable under the conditions of anticipated use and environment, yet is also relatively compact and inexpensive to manufacture.

Further included within this object is the provision of illumination for the signal generator assembly.

In accordance with the invention there is provided an improved signal generator assembly particularly suited for use in providing input signals to entry systems associated with vehicles and buildings, which signal generator includes a piezoelectric subassembly, a flexible electroluminescent panel and a transparent cover element arranged in mutual force-transmitting relation, the electroluminescent panel being interposed between the cover element and the piezoelectric subassembly.

The piezoelectric subassembly includes a substrate member which typically is a strip of metal, at least one, and typically several, piezoelectric elements affixed to the substrate member and electrical conductors connected to the opposite sides of the respective piezoelectric elements for developing thereacross respective signal voltages in response to actuation of the respective piezoelectric element.

The piezoelectric elements are disc-shaped crystals of lead zirconate titanate or the like and are conductively affixed to the conductive substrate member. A respective rigid annular terminal is conductively affixed to the other surface of each of the crystals for supplying a signal in response to actuation of that crystal. The crystals are positioned on the reverse side of the substrate member from the electroluminescent panel. An applique sheet bearing certain indicia is conveniently positioned between the electroluminscent panel and the cover member, though the indicia might alternatively have been disposed directly on either one of them. The cover element is provided as an integral portion of a plastic housing which receives the electroluminescent panel and the piezoelectric subassembly. The cover, the electroluminescent panel and the piezoelectric subassembly are maintained in sealed, force-transmitting relation by potting within the housing. A removable jig or one or more retaining clips may be used to maintain the positioning of the various elements prior to and during the potting operation.

BEST MODE FOR CARRYING OUT THE INVENTION

Figure 1:
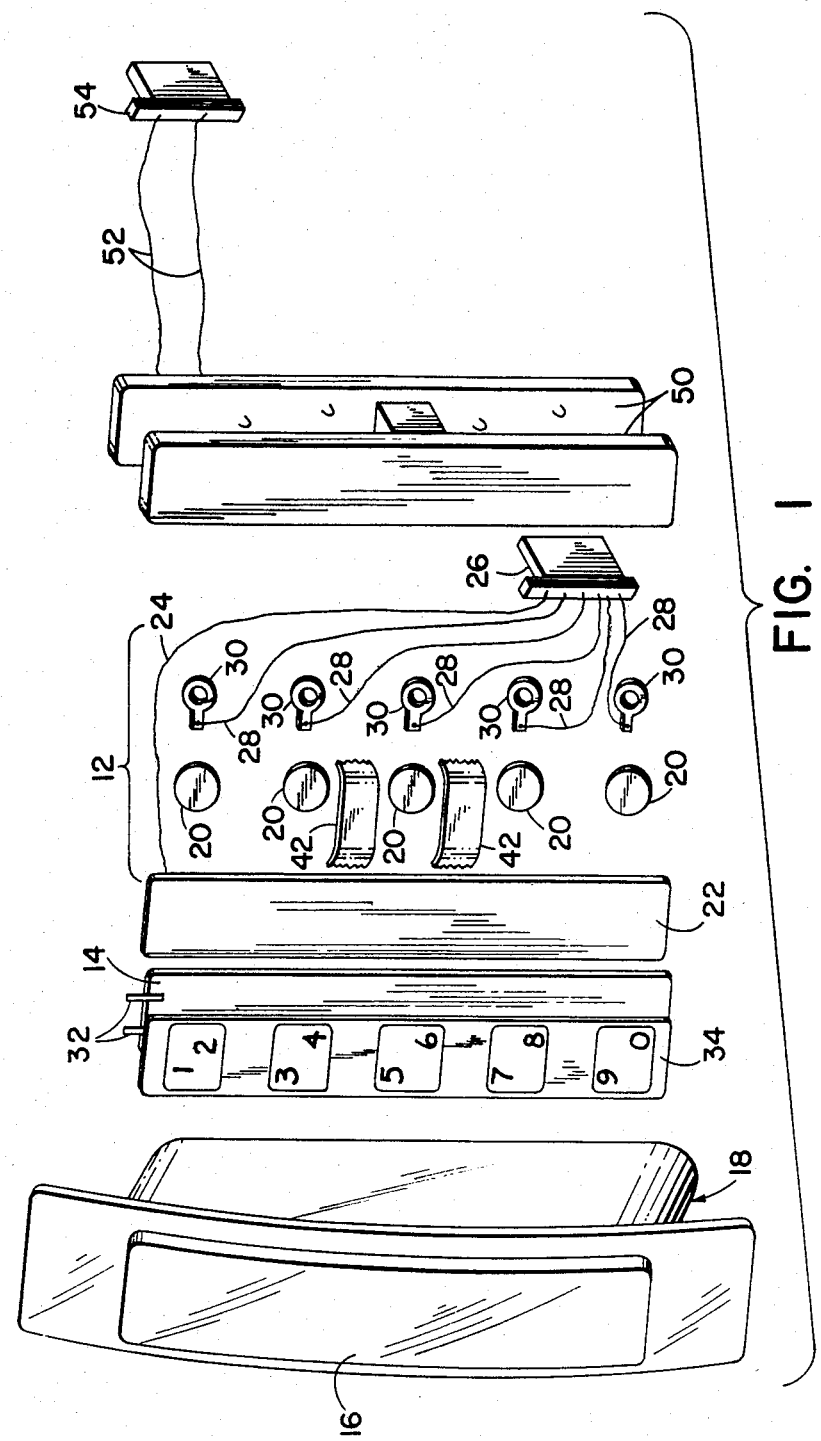
FIG. 1 illustrates an exploded view of the signal generator assembly of the invention.
Figure 2:
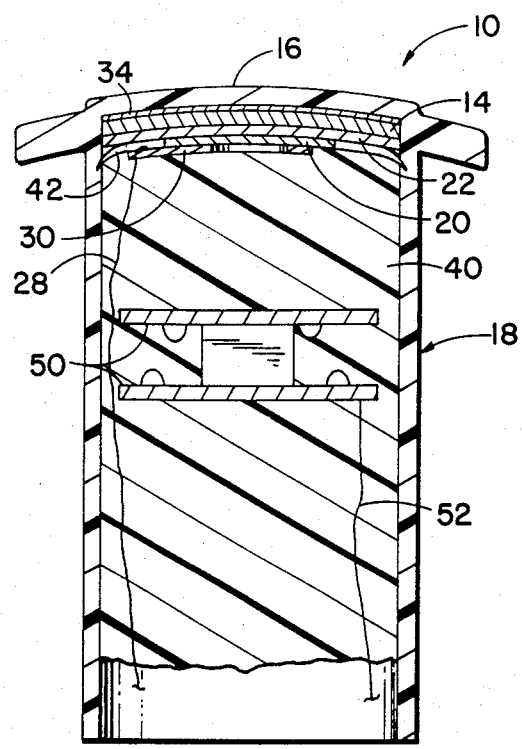
FIG. 2 is a cross-sectional view through the signal generator.

Referring to the drawings, FIG. 1 illustrates the signal generator assembly of the invention prior to assembly, and FIG. 2 illustrates the signal generator following assembly. Generally speaking, the signal generator assembly 10 comprises a piezoelectric subassembly 12, an electroluminescent panel 14 and a transparent cover 16. The electroluminescent panel 14 is positioned intermediate the piezoelectric subassembly 12 and the cover 16 such that they are in mutual force-transmitting relationship. The cover 16 is conveniently provided as an integral portion of a frame or housing 18 which additionally contains the electroluminescent panel 14 and the piezoelectric subassembly 12.

The piezoelectric subassembly 12 is provided by an array of discrete piezoelectric elements 20 conductively affixed to a substrate member, such as the phosphorous bronze strip 22. The piezoelectric elements 20 are disc-shaped crystals of lead zirconate titanate or the like, for providing enhanced resistance to moisture and for providing a strong electrical signal in response to a particular applied force. In the illustrated embodiment there are five piezoelectric crystals 20 each spaced from one another so as to minimize cross-talk. Each crystal 20 is rigidly bonded to the surface of the conductive substrate strip 22 by means of conductive solder or the like. An electrically conductive lead 24 extends from the substrate strip 22 to an electrical connector 26. Thus, one surface of each of the crystals 20 is connected electrically in common with the others. A separate electrical conductor is connected to the opposite surface of each of the crystals 20 in a suitable manner. More specifically, five electrical leads 28 extend from connector 26 to five respective terminals 30. Each terminal 30 is substantially rigid and of annular form and is conductively bonded as by solder to that surface of each crystal 20 opposite the surface bonded to the substrate 22. The terminals 30 are sufficiently rigid to facilitate their handling during assembly, yet are open in their centers to facilitate flexure of the respective crystals 20.

The electroluminescent panel 14 provides illumination for the signal generator. The electroluminescent panel 14 is relatively thin and flexible, being less than 1 mm thickness. In a conventional manner, an AC voltage is connected (not shown) to the electroluminescent panel 14 via a pair of terminal strips 32. The electroluminescent panel 14 may be of conventional design, and is required to provide a relatively even light and to possess some flexibility. The undersurface of the electroluminescent panel 14 is typically in contact with the upper surface of substrate 22. Thus, the undersurface of panel 14 is preferably electrically insulated from the substrate strip 22.

In order to identify the location and/or characteristic of the respective crystals 20, it is desirable to provide a respective identifying indicium or indicia. The indicia, which in the illustrated embodiment are respective numerals, are conveniently provided on a decal or applique 34. The applique 34 is quite thin and flexible, being typically about 0.1 mm in thickness. The decal or applique 34 is preferably of plastic, having a requisite transparency for defining the numerals or any other indicia which are to be illuminated by the electroluminescent panel 14. The applique 34 is typically positioned between the electroluminescent panel 14 and the transparent cover 16. While the indicia might alternatively be incorporated as part of either the electroluminescent panel 14 or the cover 16, their incorporation in the applique 34, as by virtue of a silk screening process, is particularly suited to high volume, durable, low cost production, and avoids the need to discard a more expensive element if the printing process is in any way defective.

The transparent cover 16 is preferably rigid yet sufficiently flexible to allow a manually applied force of 0.25–1.0 Kilograms to be transmitted therethrough to the piezoelectric crystals 20. As used herein the phrase "flexible" or "sufficiently flexible" only requires the member to be capable of a displacement of 0.025 mm or even less, that being sufficient to transmit the requisite force to a piezoelectric element 20. Although the cover 16 might be a separate element combined in some suitable manner as part of the signal generator assembly, in the preferred embodiment that cover is an integral portion of the plastic housing 18. The transparent cover 16 is thick enough to provide durability, yet is thin enough to transmit the requisite forces to the crystals 20. In the illustrated embodiment cover 16 is about 1.5 mm thick. The remainder of the housing 18 may, of course, be of some other thickness. The housing 18 generally defines a cavity which is closed at its upper or front end by the cover 16 and which is open at the opposite end for the installation for the remaining elements of the signal generator.

To assemble the signal generator 10, the various elements are loaded into the cavity of housing 18 in serial or sandwich fashion. First, the applique 34 is positioned adjacent the cover portion 16. Next, the electroluminescent panel 14 is positioned adjacent the applique 34. Then, the piezoelectric subassembly 12 is installed adjacent the electroluminescent panel 14, with the crystals 20 disposed on the side of the substrate 22 away from the electroluminescent panel 14 and cover 16.

It is important that the piezoelectric crystals 20 be capable of generating their respective electrical signals in response to a relatively modest applied pressure and minimal deflection of the cover member 16 and the other intermediate elements. Accordingly, the piezoelectric subassembly 12, the electroluminescent panel 14 and the applique 34 are all positioned and must be maintained in mutual force-transmitting relation with the cover 16 for satisfactory generation of electrical signals. To assure this result, the several elements of the signal generator are maintained in mutual force-transmitting relation while a potting compound such as epoxy 40 is introduced to the housing 18 and is allowed to set.

The elements of the signal generator might be held in position by a jig or other suitable means during potting. Alternatively, one or more mounting or retaining clips 42 might be used. The retaining clips 42 are of a shallow U-shape, with teeth arranged at the ends of the arms. The arms of the U-shaped clips 42 are outwardly flared slightly. The inner walls of the housing 18 are provided with a very shallow draft angle. Accordingly, the retaining clips may be easily inserted into the housing 18 and urged into contact with the piezoelectric subassembly 12, and the rearwardly-directed teeth on the arms of the retaining clip engage the inner walls of the housing and maintain it in that position. The retaining clips 42 are preferably installed in the spaces between adjacent crystals 20 so as to avoid impeding the deformation of any crystal in response to a manually applied actuating force.

Following the installation of the aforementioned elements of the signal generator into housing 18, additional electronics mounted on boards 50 may also be positioned within the cavity of the housing for potting by compound 40. One or more conductive leads 52 connect the electronics on boards 50 to an external connector 54. The electronics on boards 50 may include some of the signal processing circuitry disclosed in the aforementioned U.S. Pat. Nos. 4,190,785 and 4,206,491.

The signal generator assembly 10 constructed in accordance with the foregoing description is particularly suited for reliable, long-term operation in the often adverse environment of an entry system.

Although this invention has been shown and described with respect to detailed embodiments thereof, it will be understood by those skilled in the art that various changes in form and detail thereof may be made without departing from the spirit and scope of the claimed invention.

Having thus described a typical embodiment of the invention, that which is claimed as new and desired to be secured by Letters Patent of the United States is:

1. A signal generator assembly comprising:
   a piezoelectric subassembly, including a substantially planar, rigid yet manually flexible, substrate member, one or more discrete piezoelectric elements affixed to said substrate member and respective electrical conducting means connected to opposite sides of each said piezoelectric element for developing a signal voltage therebetween in response to deformation of the respective piezoelectric element by an applied force;
   a flexible electroluminescent panel;
   a plastic housing having a cavity and including a transparent, rigid yet manually flexible, cover element, said cover element being an integral portion of said housing;
   said piezoelectric subassembly and said electroluminescent panel being positioned in said housing cavity in mutual force-transmitting relation with said cover element, said electroluminescent panel being interposed between said cover element and said piezoelectric subassembly; and
   means disposed in said housing cavity for maintaining said cover element and said piezoelectric subassembly in sealed, force-transmitting relation with said cover element.

2. The signal generator assembly of claim 1 further including means between said electroluminescent panel and said cover element for displaying a respective indicium with the respective piezoelectric element.

3. The signal generator assembly of claim 2 wherein said indicium display means comprises an applique sheet interposed between said electroluminescent panel and said cover element.

4. The signal generator assembly of claim 1 wherein said means for maintaining said cover element and said piezoelectric subassembly in sealed, force-transmitting relation includes potting compound.

5. The signal generator assembly of claim 4 wherein said means for maintaining said cover element and said piezoelectric subassembly in sealed, force-transmitting relation further includes one or more permanent retaining clips which engage said housing and said piezoelectric subassembly to maintain their relative positions.

6. The signal generator assembly of claim 1 wherein each said piezoelectric element comprises a discrete crystal.

7. The signal generator assembly of claim 6 wherein said substrate member includes a conductive surface, each said piezoelectric crystal being conductively affixed to said substrate member for thereby providing an electrical conducting means connected in common to one of said opposite sides of each said piezoelectric crystal.

8. The signal generator assembly of claim 7 wherein said electrical conducting means further includes a respective separate terminal member conductively affixed to the other of said opposite sides of each said piezoelectric crystal.

9. The signal generator assembly of claim 8 wherein each said terminal member is substantially annular and rigid to facilitate assembly and durability while also permitting the respective piezoelectric crystal to deform in reponse to an applied force.

10. The signal generator assembly of claim 9 wherein said substrate member is a thin strip of metal.

11. The signal generator assembly of claim 10 wherein one side of said substrate member faces said electroluminescent panel and each piezoelectric crystal is affixed to the other side of said substrate member.

* * * * *